(12) United States Patent
Shepston et al.

(10) Patent No.: US 11,812,544 B2
(45) Date of Patent: Nov. 7, 2023

(54) BREAKOUT STRUCTURE FOR AN INTEGRATED CIRCUIT DEVICE

(71) Applicant: XILINX, INC., San Jose, CA (US)

(72) Inventors: Shad Shepston, Broomfield, CO (US); Robert Andrew Daniels, March (GB)

(73) Assignee: XILINX, INC., San Jose, CA (US)

( * ) Notice: Subject to any disclaimer, the term of this patent is extended or adjusted under 35 U.S.C. 154(b) by 16 days.

(21) Appl. No.: 17/557,877

(22) Filed: Dec. 21, 2021

(65) Prior Publication Data

US 2023/0199941 A1    Jun. 22, 2023

(51) Int. Cl.
*H05K 1/11* (2006.01)
*H05K 1/02* (2006.01)
*H05K 1/18* (2006.01)

(52) U.S. Cl.
CPC ......... *H05K 1/0228* (2013.01); *H05K 1/0219* (2013.01); *H05K 1/114* (2013.01); *H05K 1/181* (2013.01); *H05K 2201/093* (2013.01); *H05K 2201/09709* (2013.01); *H05K 2201/10378* (2013.01); *H05K 2201/10734* (2013.01)

(58) Field of Classification Search
CPC ........ H05K 1/111; H05K 1/112; H05K 1/114; H05K 1/115; H05K 1/116
See application file for complete search history.

(56) References Cited

FOREIGN PATENT DOCUMENTS

EP          2339901 A1 *  6/2011  ............. H05K 1/114

\* cited by examiner

*Primary Examiner* — Jeremy C Norris
(74) *Attorney, Agent, or Firm* — Patterson + Sheridan, LLP

(57) ABSTRACT

Apparatus having at least one breakout structure are provided. In one example, an apparatus includes a dielectric layer, first and second contact pads, and first and second vias. The first and second contact pads are disposed on the dielectric layer. The first via is disposed through the dielectric layer and coupled to the first contact pad. The first via is offset from the first contact pad in a first direction. The second contact pad is immediately adjacent the first via. The second via is disposed through the dielectric layer immediately adjacent the first contact pad and coupled to the second contact pad. The second via is offset from the second contact pad in a second direction that is opposite of the first direction. The first and the second contact pads define a first differential pair of contact pads that is configured to transmit a first differential pair of signals.

20 Claims, 5 Drawing Sheets

BREAKOUT STRUCTURE FOR AN INTEGRATED CIRCUIT DEVICE

TECHNICAL FIELD

Embodiments of the present invention generally relate to chip packages and printed circuit boards, and in particular, to breakout structures for efficiently connecting chip packages and printed circuit boards.

BACKGROUND

Electronic devices, such as tablets, computers, copiers, digital cameras, smart phones, control systems, automated teller machines, data centers, artificial intelligence system, and machine learning systems among others, often employ electronic components which leverage chip packages for increased functionality and higher component density. Conventional chip packaging schemes often utilize a package substrate, often in conjunction with a through-silicon-via (TSV) interposer substrate, to enable a plurality of integrated circuit (IC) dies to be mounted to a single package substrate. The IC dies may include memory, logic or other IC devices. The chip packages are typically coupled to a printed circuit board using a ball grid array (BGA).

The BGA is formed from an array of solder balls located on a bottom external surface of a package substrate. The solder balls are reflowed to attach the package both electrically and mechanically to contact pads formed on the top surface of the PCB.

Traditional, most contact pads of the PCB is connected on by a surface trace formed on the top surface of the PCB to a neighboring via. The via extends into or through the PCB, and is connected to a metal trace routed parallel to the top surface which routes the circuit to another contact pad of the PCB, thus completing the electrical circuit between the contact pads of the PCB, and ultimately to the IC die of the chip package. The arrangement of traces leading out from the contact pads disposed under and coupled to the chip package to the other, freely accessible contact pads of the PCB is known as breakout or fanout structure. In the breakout structure, the traces escape from underneath the chip package and are routed to another area of the PCB clear of the chip package where the contact pads of the PCB can be engaged with another electrical device.

As the number of contact pads and solder balls comprising the BGA increase, while the density of contact pads and traces also increase, fabricating an effective, high performance breakout structure is becoming increasingly challenging. For example in traditional BGA, the surface traces generally run diagonally in the same direction along the top surface of the PCB between the contact pads and vias to create more useable area beneath the chip package. However, with data rates at 32 Gb and higher, the spacing between routings must be keep relatively large in order to maintain acceptable levels of signal fidelity. Thus, traditional unidirectional diagonal breakouts patterns begin to suffer performance issues at high density and data rates.

Therefore, a need exists for apparatus having an improved breakout structure.

SUMMARY

Apparatus having at least one breakout structure are provided. In one example, an apparatus includes a dielectric layer, first and second contact pads, and first and second vias. The first and second contact pads are disposed on the dielectric layer. The first via is disposed through the dielectric layer and is coupled to the first contact pad. The first via is offset from the first contact pad in a first direction. The second contact pad is immediately adjacent the first via. The second via is disposed through the dielectric layer immediately adjacent the first contact pad and is coupled to the second contact pad. The second via is offset from the second contact pad in a second direction that is opposite of the first direction. The first and the second contact pads define a first differential pair of contact pads that are configured to transmit a first differential pair of signals.

In another example, an apparatus having at least one breakout structure includes a dielectric layer, a first contact pad, a first via, a second contact pad, and a second via. The first contact pad is disposed on the dielectric layer. The first via is disposed through the dielectric layer and coupled to the first contact pad. The first via and the first contact pad are separated by a first distance. The second contact pad is disposed on the dielectric layer. The second via is disposed through the dielectric layer and coupled to the second contact pad. The first contact pad and the second contact pad include a first differential pair of contact pads configured to transmit a first differential pair of signals. The second contact pad and the first contact pad are separated by a second distance that is greater than the first distance.

In yet another example, an apparatus having at least one breakout structure includes a dielectric layer, a first contact pad, a first via, a second contact pad, a second via, a third contact pad, a third via, a fourth contact pad, and a fourth via. The first and second contact pads are disposed on the dielectric layer. The first via is disposed through the dielectric layer and coupled to the first contact pad. The first via offset is from the first contact pad in a first direction, and the first via and the first contact pad separated by a first distance. The first contact pad and the second contact pad define a first differential pair of contact pads configured to transmit a first differential pair of signals. The second contact pad and the first contact pad are separated by a second distance that is greater than the first distance. The second via is disposed through the dielectric layer and coupled to the second contact pad. The second via is offset from the second contact pad in a second direction that is opposite of the first direction. The third via is disposed through the dielectric layer and coupled to the third contact pad. The third via and the third contact pad are separated by a third distance. The fourth contact pad and the fourth contact pad define a second differential pair of contact pads configured to transmit a second differential pair of signals. The fourth contact pad and the third contact pad separated by a fourth distance that is greater than the third distance. The fourth via is disposed through the dielectric layer and coupled to the fourth contact pad. A distance between a closest contact pad of one of the first differential pair or the second differential pair to a via of the other of the first differential pair or the second differential pair is less than a distance between closest contact pads of the first and second differential pairs.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not

To facilitate understanding, identical reference numerals have been used, where possible, to designate identical elements that are common to the figures. It is contemplated that elements of one embodiment may be beneficially incorporated in other embodiments.

DETAILED DESCRIPTION

Apparatus having at least one breakout structure are provided. The breakout structure may reside in any one or more of an integrated circuit die, a redistribution layer defined below and coupling with the integrated circuit die, an interposer, a package substrate or a printed circuit board (PCB). The breakout structure leverages traces extending in different, and in some examples opposite, directions between vias and contact pads of a differential pair of contact pads that are configured to transmit a differential pair of signals. The novel breakout structure described herein reduces the proximity between aggressor and victim (i.e., high and low power) signal carrier, which significantly reduces crosstalk and improves signal fidelity. In some configurations, the trace routing of adjacent the differential pairs may be advantageously arranged to maintain alternating trace polarity and/or trace length matching for improved performance.

Figure 1A:
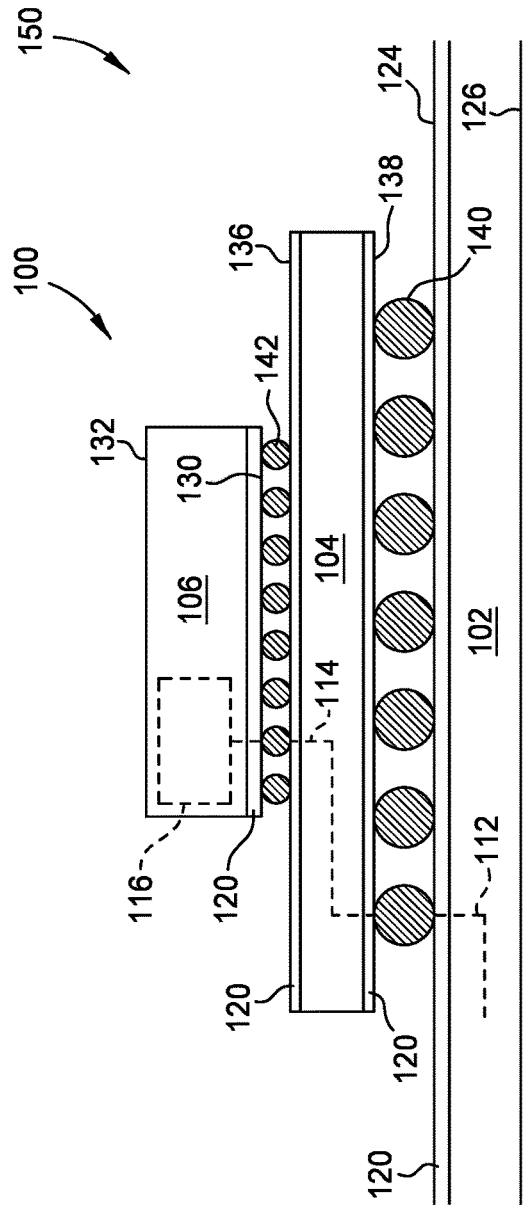
FIGS. 1A and 1B are schematic front views of electronic devices having a chip package disposed on a printed circuit board (PCB) illustrating various locations in which one or more breakout structures may reside.

Turning now to FIG. 1A, FIG. 1A is a schematic sectional view of an electronic device 150 having a chip package 100 disposed on a printed circuit board (PCB) 102 having one or more interconnect regions 120 in which breakout structures may reside. The interconnect regions 120 and breakout structures are further described below with reference to FIGS. 2-4.

Continuing to refer to FIG. 1A, the chip package 100 includes at least one or more integrated circuit (IC) die 106 mounted to a package substrate 104. The IC die 106 includes functional circuitry 116 that may include block random access memory (BRAM), UltraRAM (U RAM), digital signal processing (DSP) blocks, configurable logic elements (CLEs), and the like. The IC die 106 may be, but is not limited to, programmable logic devices, such as field programmable gate arrays (FPGA), memory devices, such as high band-width memory (HBM), optical devices, processors or other IC logic structures. The IC die 106 may optionally include optical devices such as photo-detectors, lasers, optical sources, and the like. In the example of FIG. 1, the IC die 106 is a logic die having math processor (also known as math engine) circuitry for accelerating machine-learning math operations in hardware, such as self-driving cars, artificial intelligence and data-center neural-network applications.

In another example, the one or more IC dies 106 includes a plurality of IC dies 106. The IC dies 106 may be disposed in a vertical stack and/or disposed laterally side by side. It is contemplated that the IC dies 106 comprising the plurality of IC dies 106 may be the same or different types, including types other than FPGA dies. Although only one IC die 106 is shown in FIG. 1, the number of IC dies 106 disposed in the chip package 100 may vary from one to as many as can fit within the chip package 100.

The IC die 106 includes a die body having a bottom surface 130 and a top surface 132. The bottom surface 130 of the IC die 106 is mechanically and electrically connected to a top surface 136 of the package substrate 104 by solder interconnects 142. The solder interconnects 142 electrically connects the functional circuitry 116 of the IC die 106 to the package circuitry 114 formed through the package substrate 104. The package circuitry 114 is electrically connected to the circuitry 112 of the PCB 102 by solder balls 140. The solder balls 140 mechanically and electrically connected to a top surface 124 of the PCB 102 to a bottom surface 138 of the package substrate 104. The PCB 102 also includes a bottom surface 126 that is opposite the top surface 124.

Figure 1B:
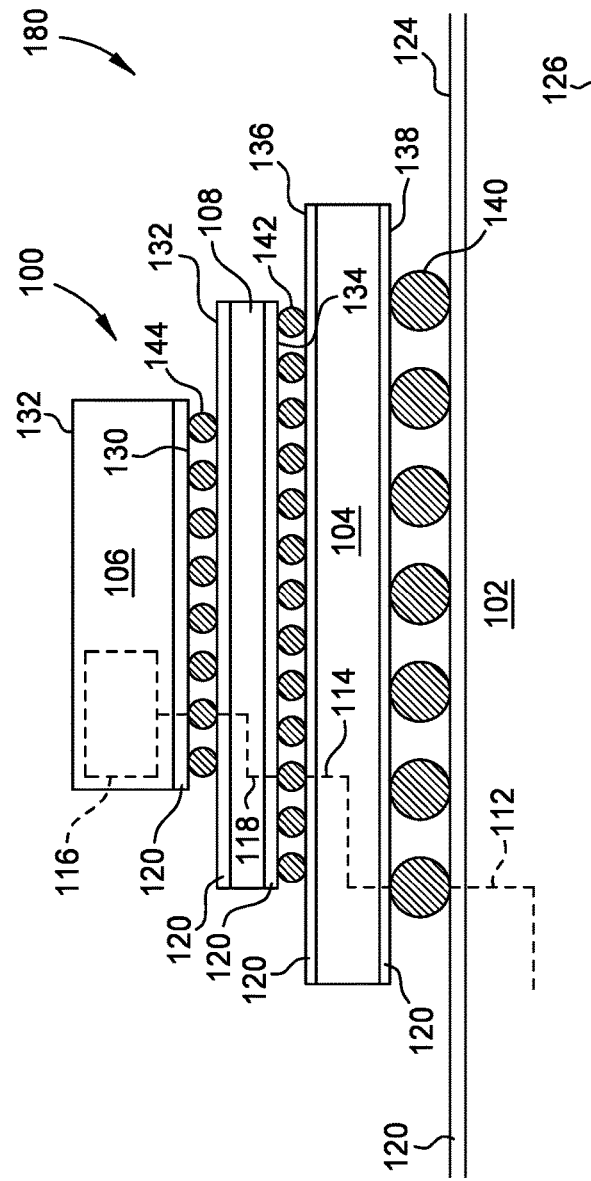

Optionally, an interposer 108 may reside between the package substrate 104 and IC die 106 as shown in an electronic device 180 illustrated in FIG. 1B. The electronic device 180 is generally the same as the electronic device 150 described above, except for the inclusion of the interposer 108.

The interposer 108 includes a bottom surface 134 facing the top surface 136 of the package substrate 104 and a top surface 132 facing the bottom surface 130 of the IC die 106. Interposer circuitry 118 is formed through the interposer 108. The interposer circuitry 118 is coupled to the functional circuitry 116 of the IC die 106 by solder interconnects 144, and to the package circuitry 114 of the package substrate 104 by solder interconnects 142.

In both of the electronic devices 150, 180 illustrated in FIGS. 1A and 1B, interconnect regions 120 facilitate the electrical routing at the interfaces defined between the IC die 106, interposer 108, package substrate 104 and PCB 102. When in the IC die 106, the interconnect region 120 generally includes the top metal layers and contact pads of the BOEL layers of the IC die 102. Optionally, the interconnect region 120 may include or alternatively be a redistribution layer residing directly below the IC die 106. The redistribution layer electrically and mechanically connects the IC die 106 with neighboring interposer 108 or package substrate 104. The redistribution layer includes a plurality of lines and vias, separated by dielectric layers, in which an interconnect metalization is formed. In the interposer 108 and package substrate 104, the interconnect regions 120 may be formed on the top and/or bottom surfaces. 132, 142, 136, 138. Interconnect regions 120 of the interposer 108 and/or package substrate 104 generally include built-up layers in which interconnect routing is formed from metal layers and vias, terminating at contact pads. In the PCB 102, the interconnect region 120 generally includes contact pads connected by traces to vias. The interconnect region 120 of the PCB 102 may also include additional metal layers, vias, and traces. As described above, any one, some or all of the interconnect regions 120 shown in FIGS. 1A and 1B may have breakout structures.

Figure 2:
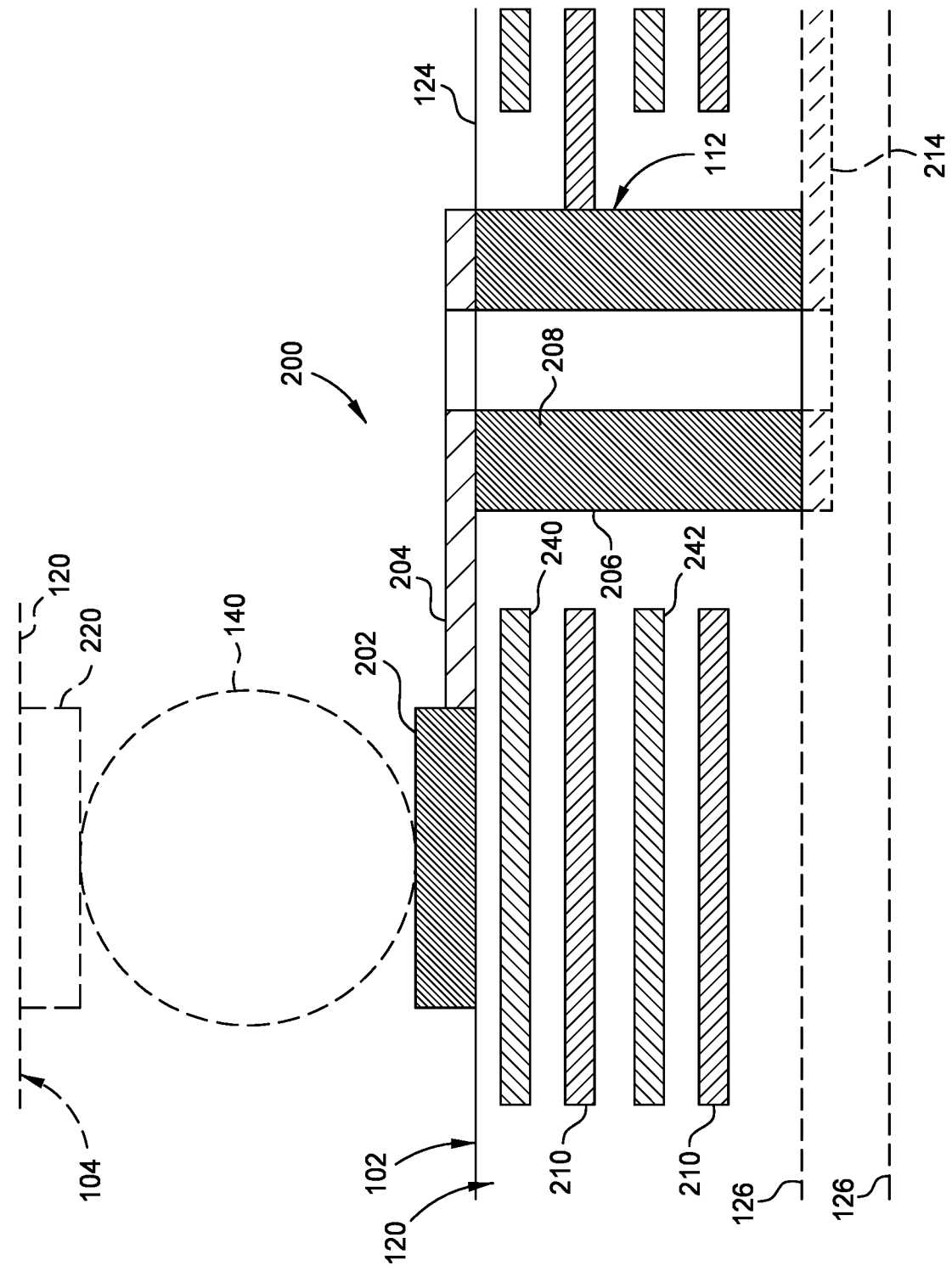
FIG. 2 is a partial sectional view of one example of a portion of a breakout structure formed on the PCB.

FIG. 2 is a partial sectional view of one example of a small portion of a breakout structure 200 formed in the interconnect region 120 of the PCB 102. The breakout structure 200 may be similarly configured in any one, some or all of the other interconnect regions 120, such as in the form of a redistribution layer, or as part of the IC die 106, the interposer 108 and the package substrate 104.

The breakout structure 200 generally includes a contact pad 202, a trace 204 and a via 206. The via 206 is formed partially or completely through a laminate of dielectric material 212 forming the PCB 102. The via 206 is lined or filled with a conductive material, such as aluminum, copper and the like. An end of the via 206 open to the top surface 124 of the PCB 102 is coupled to the contact pad 202 by the trace 204. Another portion of the via 206 is coupled to a metal line 210 fabricated from metal layers disposed in the laminate of dielectric material 212 forming the PCB 102 or to a metal trace 214 (shown in phantom) residing on the bottom surface 126 of the PCB 102. The contact pad 202, the trace 204, the via 206, the metal line 210 and the metal trace 214 (when present) form at least a portion of the PCB circuitry 112, with the contact pad 202 of the PCB 102 electrically and mechanically connecting to a contact pad 220 of the interconnect region 120 (and thus, the package circuitry 114) of the immediately adjacent package substrate 104.

Also illustrated in the interconnect region 120 are two ground planes 240, 242. The ground plane 240 is disposed closest to the top surface 124 of the PCB 102, while the ground plane 242 is disposed below the ground plane 240. Although not illustrated, one or more additional the ground planes 242 may be present between the ground plane 240 and the bottom surface 126 of the PCB 102.

Figure 3:
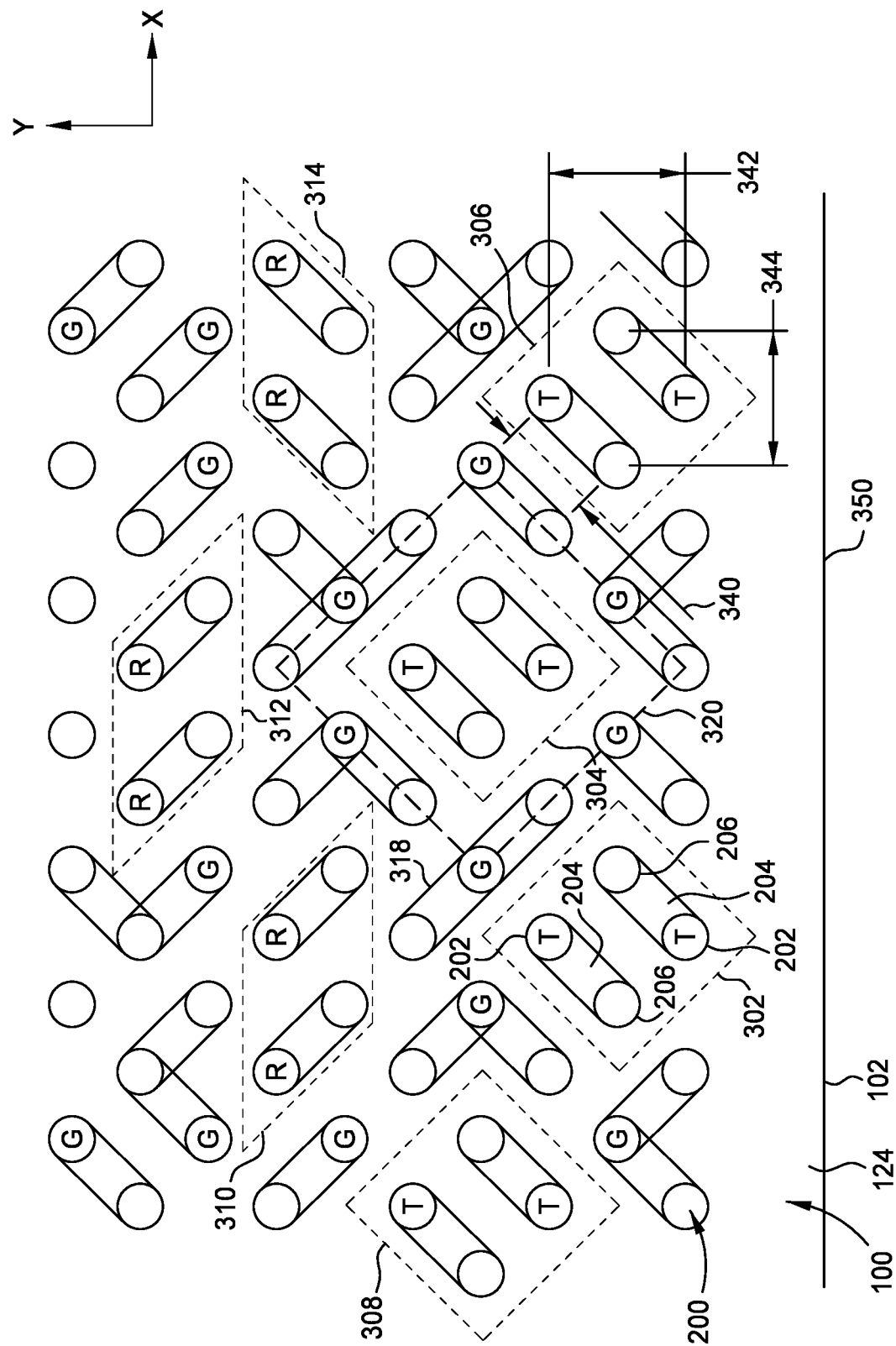
FIG. 3 is a partial top view of the PCB of FIG. 1 illustrating a portion of a breakout structure.

FIG. 3 is a partial top view of the top surface 124 of the PCB 102 illustrating a larger portion of the breakout structure 200. In FIG. 3, an array of contact pads 202 and via 206 are shown. Each contact pad 202 is coupled to one or more vias 206 by at least one trace 204. The contact pads 202 and via 206 are arranged in rows and columns. In the example depicted in FIG. 3, the rows are staggered such that no contact pad 202 or via 206 is directly above or below (in column) another contact pad 202 or via 206 in the immediately adjacent row. It is also contemplated that the array of array of contact pads 202 and via 206 may be arranged differently. The array of array of contact pads 202 are selected to allow connection with the ball grid array residing on the bottom surface 138 of the package substrate 104.

In FIG. 3, unfilled circles indicate vias 206, circles containing a "G" indicate contact pads 202 configured to couple to ground, circles containing an "R" indicate a contact pads 202 configured to transmit a signal from the PCB 102 to the IC die 106, and circles containing a "T" indicate contact pads 202 configured to transmit a signal from the IC die 106 to the PCB 102. It should be noted that the location of the "G", "R" and "T" contact pads 202 shown in FIG. 3 are for illustrative purposes, and other locations for any one or more of the "G", "R" and "T" contact pads 202 can be utilized in other breakout structures 200 as further described below.

Adjacent "R" and "T" contact pads 202 are configured as differential pairs. Some the contact pads 202 labeled as "R" are grouped as differential pairs that transmit information using complementary signals having different polarity. Similarly, some of the contact pads 202 labeled as "T" are grouped as differential pairs that transmit information using complementary signals having different polarity. The differential pairs illustrated in FIG. 3 are bounded by an imaginary dashed line. For example in FIG. 3, differential "T" pairs 302, 304, 306, 308 and differential "R" pairs 310, 312, 314 are shown.

Each differential pair is separated from a neighboring differential pair by a ground structure 318. The ground structures 318 include at least one or more "G" contact pads 202 and at least one or more vias 206 coupled by one or more traces 204. In some instances, a differential pair, such as the differential pair 304, is completely circumscribed by one or more ground structures 318, as shown by imaginary dashed line 320, which separate the differential pair 304 from neighboring differential pairs.

The ground structures 318 may various configurations as defined by the traces 204 coupling the "G" contact pads 202 to the vias 206 associated with that "G" contact pads 202. For example, utilizing an edge 350 of the PCB 102 to defined an X-Y coordinate system, with the edge 350 being parallel to the X direction, the orientation of the ground structures 318, i.e., the direction defined by the trace 204 extending from the "G" contact pad 202 to the connected via 206 is not parallel with either of the X or Y axis. For example, a trace 204 of a ground structure 318 may have an orientation directed in the any one of the (−X)/(+Y) direction, (−X)/(−Y) direction, (+X)/(+Y) direction, or (+X)/(−Y) direction. In one example, the direction of the traces 204 of the ground structure form a 45±15 degree angle with the X or Y axes. Ground structures 318 having two or more traces 204 may two traces running in the same direction, in opposite directions, or in different but not opposite directions.

At least some of the differential pairs have traces 204 running in the opposite direction. Referring to the differential pair 302 as an example, the trace 204 extending from one (T) contact pad 202 is oriented in a different direction compared to the trace 204 extending from the other (T) contact pad 202 of the differential pair 302. The directions of traces 204 of the differential pair 302 are parallel. By routing the traces 204 in opposite directions, the (T) contact pads 202 are further spaced apart relative to conventional differential pairs having the traces running in the same direction that place the contact pads in close proximity to each other.

The increased spacing between contact pads 202 is also illustrated by differential pair 306, where the pitch between pad and vias within a row is uniform and the pitch between rows is also uniform. In differential pair 306, a distance 342 defined between "T" contact pads 202 is greater than a distance 340 defined between one of the "T" contact pads 202 and it's connected via 206. Similarly, a distance 344 defined between vias 206 is greater than the distance 340. In conventional structures, the distance between pads in a conventional differential pair is generally the same as the distance between a pad and it's connected via of the conventional differential pair.

The alternating directions of the traces within a differential pair allows the contact pads of adjacent neighboring differential pairs to be arranged so that the contact pads are spaced further apart than would be possible compared to contact pads of conventional differential pairs having unidirectional trace orientation. This advantageous arrangement is readily apparent in FIG. 3 where differential pairs 302, 304 and 304 illustrate how the alternating high and low position of the contact pads (on the Y axis) enable improved spacing between contact pads of adjacent differential pairs. Coupled with the ground structures 318 being disposed between adjacent differential pairs, the opposite directional orientation of the traces within a differential pair significantly reduces crosstalk and improves signal fidelity.

In FIG. 3, some of the differential pairs, such as the differential pairs 310, 312, 314 that include "R" contact pads 202 may have the traces 206 within a differential pair running in the same direction. Alternatively, one, some or all of the differential pairs 310, 312, 314 may have the traces 206 within a differential pair running in the opposite direction. Additionally, one, some or all of the differential pairs that include "R" contact pads 202 may have traces that run parallel, non-parallel, or in the mirror image of one, some or all of the differential pairs that include "T" contact pads 202. Advantageously, all or most of the differential "T" pairs are separated from the neighboring differential "R" pairs by at least one ground structure 318.

Although not shown in breakout structure 200 depicted in FIG. 3, the vias 206 are coupled to metal line 210 and/or metal trace 214 within or on the PCB 102 terminates a contact pad not shown for connecting circuitry 112 the PCB 102 to a device remote from or part of the electronic devices 150, 180.

Figure 4:
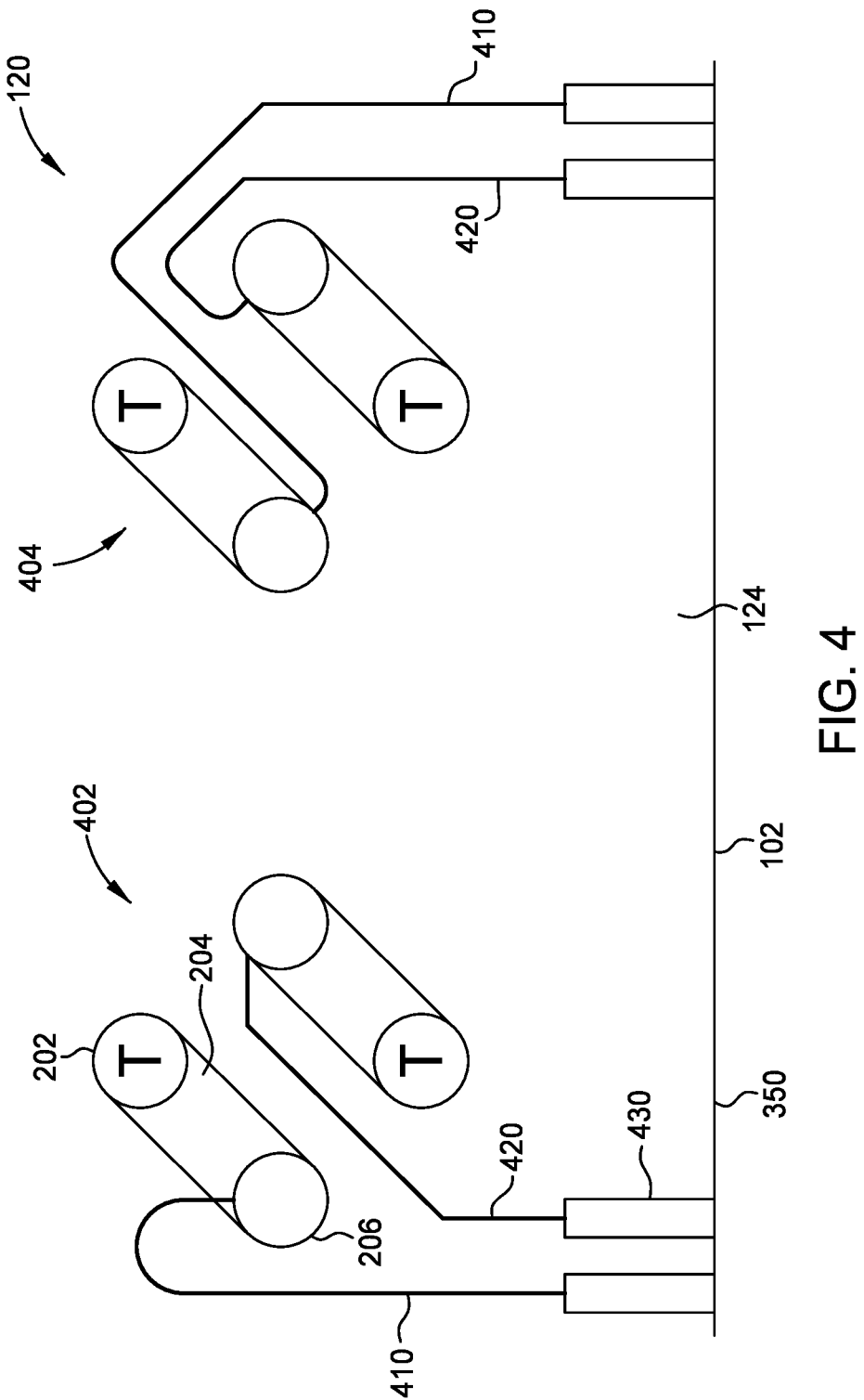
FIG. 4 is a partial top view of the PCB of FIG. 1 illustrating a portion of another example of a breakout structure.

FIG. 4 is a partial top view of the PCB 102 of FIG. 1 illustrating a portion of another example of a breakout structure 400 that illustrates trace routings 410, 420 that terminate at edge connectors 430 formed along the edge 350 of the PCB 102. In FIG. 4, a first differential pair 402 and a second differential pair 404 are shown having traces 204 extending in parallel. The traces 204 run in opposite directions within each of the differential pairs 402, 404.

Within the first differential pair 402, the trace routing 410 is coupled to a contact pad 202 configured to transmit a signal of one polarity, while the trace routing 420 is coupled to a contact pad 202 configured to transmit a signal of the opposite polarity. Similarly within the second differential pair 404, the trace routing 410 is coupled to a contact pad 202 configured to transmit a signal of one polarity, while the trace routing 420 is coupled to a contact pad 202 configured to transmit a signal of the opposite polarity.

The trace routings 410, 420 may be the same or different orientation between the adjacent differential pairs 402, 404. In the example depicted in FIG. 4, the trace routing 410 is disposed to one side of the trace routing 420 when extending from the first differential pair 402 to the edge connectors 430 formed along the edge 350 of the PCB 102, while the trace routing 410 is disposed to the opposite side of the trace routing 420 when extending from the second differential pair 404 to the edge connectors 430 formed along the edge 350 of the PCB 102. The ability to swap the routes (i.e., location) of traces having different polarity significantly increases the routing flexibility while maintaining high signal fidelity.

Figure 5A:
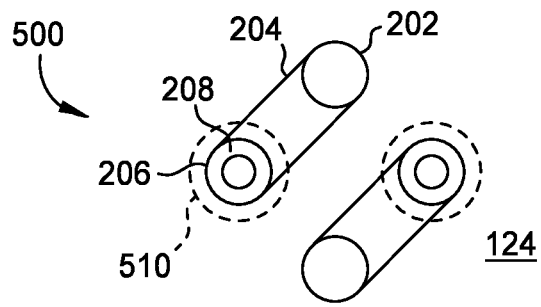
FIGS. 5A-5D are top and sectional views of a portion of the PCB of FIG. 1 illustrating the relationship between the vias of a differential pair and the ground planes within the PCB.
Figure 5B:
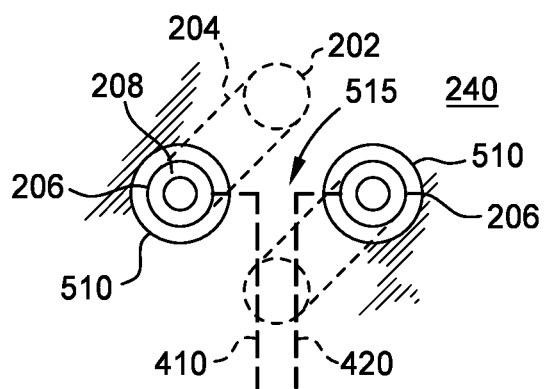
Figure 5C:
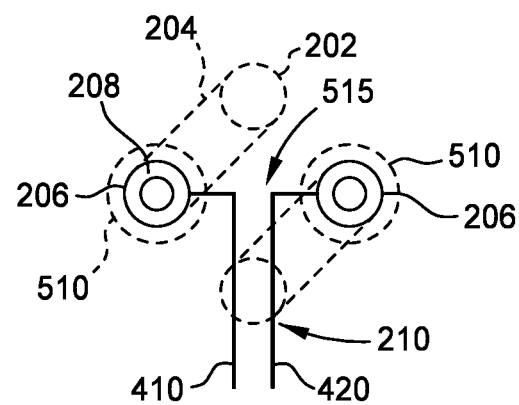
Figure 5D:
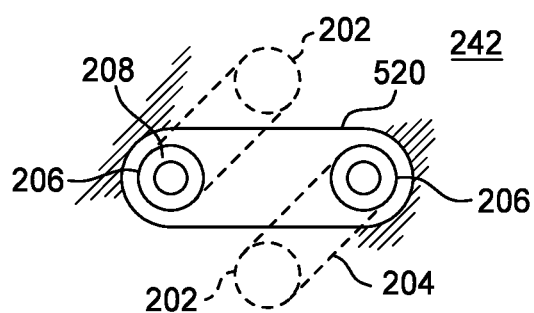

FIGS. 5A-5D are top and sectional views of a portion of the PCB of FIG. 1 illustrating the relationship between vias 206 of a differential pair 500 and the ground planes 240, 242 within the PCB 102 (or other interconnect region 120 disposed within the chip package 100. The ground planes 240 closest to the top surface 124 of the PCB 102 generally includes a plurality of apertures 510. Each aperture 510 has a single one of the vias 206 of the differential pair 500 passing therethrough. A portion 515 of the ground plane 240 separates the via of the differential pair 500. The trace routings 410, 420 are coupled to the vias 206 and resides on the metal layer 210 disposed below the ground plane 240. The portion 515 of the ground plane 240 separates the trace routings 410, 420 from the traces 204 coupling the vias 206 to the contact pads 202, thus providing EMI shielding between the trace routings 410, 420 from the traces 204. The ground plane 242 also includes apertures 520 through which the vias 206 extend. Each aperture 520 may be configured to allow a single via 206 to pass therethrough similar to the apertures 510. Alternatively as depicted in FIG. 5C, each aperture 520 may be configured to allow a multiple vias 206 of the differential pair 500 to pass therethrough.

Thus, a breakout structure has been provided that enables significant improvements in signal fidelity over convention designs having unidirectional traces in differential pairs. The opposing directional orientation of trace routing within a differential pair has also shown significant reduction in crosstalk. Ground structures that are directionally unrestrained relative to trace orientation allow for ground structures to be present between neighboring differential pairs, and in some examples, completely circumscribe a differential pair to provide excellent signal isolation, thus improving device performance even at date transmission rates exceeding 32 Gb per second. Additionally, the flexibility to swap polarity of trace routing within the breakout structure improves routing flexibility, and thus, allows for increased device performance.

While the foregoing is directed to embodiments of the present invention, other and further embodiments of the invention may be devised without departing from the basic scope thereof, and the scope thereof is determined by the claims that follow.

What is claimed is:

1. An apparatus comprising:
   a dielectric layer;
   a first contact pad disposed on the dielectric layer;
   a first via disposed through the dielectric layer and coupled to the first contact pad, the first via offset from the first contact pad in a first direction;
   a second contact pad disposed on the dielectric layer and immediately adjacent the first via;
   a second via disposed through the dielectric layer immediately adjacent the first contact pad and coupled to the second contact pad, the second via offset from the second contact pad in a second direction that is opposite of the first direction, the first contact pad and the second contact pad comprising a first differential pair of contact pads configured to transmit a first differential pair of signals;
   a third contact pad disposed on the dielectric layer;
   a third via disposed through the dielectric layer and coupled to the third contact pad, the third via offset from the third contact pad in a third direction that is perpendicular to the first direction;
   a fourth contact pad disposed on the dielectric layer and separated from the third contact pad by the first differential pair of contact pads; and
   a fourth via disposed through the dielectric layer and coupled to the fourth contact pad, the fourth via offset from the fourth contact pad in a fourth direction that is perpendicular to the first direction, the third contact pad and the fourth contact pad configured to be coupled to ground.

2. The apparatus of claim 1, wherein the third direction is opposite the fourth direction.

3. The apparatus of claim 1 further comprising:
   a fifth contact pad disposed on the dielectric layer;
   a fifth via disposed through the dielectric layer and coupled to the fifth contact pad, the fifth via offset from the fifth contact pad in a fifth direction that is parallel to the first direction;
   a sixth contact pad disposed on the dielectric layer and separated from the fifth contact pad by the first differential pair of contact pads; and
   a sixth via disposed through the dielectric layer and coupled to the sixth contact pad, the sixth via offset from the sixth contact pad in a sixth direction that is parallel to the first direction, the fifth contact pad and the sixth contact pad configured to be coupled to ground.

4. The apparatus of claim 1 further comprising:
a fifth contact pad disposed on the dielectric layer;
a fifth via disposed through the dielectric layer and coupled to the fifth contact pad, the fifth via offset from the fifth contact pad in a fifth direction that is perpendicular to the first direction;
a sixth contact pad disposed on the dielectric layer and separated from the fifth contact pad by the first differential pair of contact pads; and
a sixth via disposed through the dielectric layer and coupled to the sixth contact pad, the sixth via offset from the sixth contact pad in a sixth direction that is perpendicular to the first direction, the fifth contact pad and the sixth contact pad configured to be coupled to ground.

5. The apparatus of claim 4, further comprising:
a seventh contact pad disposed on the dielectric layer and separated from the first via or first contact pad by one of the third contact pad or third via;
a seventh via disposed through the dielectric layer and coupled to the seventh contact pad, the seventh via offset from the seventh contact pad in the first direction;
an eighth contact pad disposed on the dielectric layer and immediately adjacent the seventh via; and
an eighth via disposed through the dielectric layer immediately adjacent the seventh contact pad and coupled to the eighth contact pad, the eighth via offset from the eighth contact pad in the second direction, the seventh contact pad and the eighth contact pad comprising a second differential pair of contact pads configured to transmit a seventh differential pair of signals.

6. The apparatus of claim 5, wherein one of the first and second differential pairs is configured to transmit signals to an integrated circuit (IC) die and the other of the first and second differential pair is configured to receive signals from the IC die.

7. The apparatus of claim 5, wherein the first contact pad, the second via and the seventh contact pad are linearly aligned.

8. The apparatus of claim 5 further comprising:
a first trace coupled to the first contact pad and extending to a first edge of the dielectric layer;
a second trace coupled to the second contact pad and extending to the first edge of the dielectric layer;
a third trace coupled to the seventh contact pad and extending to the first edge of the dielectric layer, the second contact pad disposed between the seventh contact pad and the first contact pad, and the second trace disposed between the third trace and the first trace; and
a fourth trace coupled to the eighth contact pad and extending to the first edge of the dielectric layer, the seventh contact pad disposed between the eighth contact pad and the second contact pad, and the fourth trace disposed between the second trace and the third trace.

9. The apparatus of claim 4 further comprising:
a seventh contact pad disposed on the dielectric layer and separated from the first via or first contact pad by one of the third contact pad or third via;
a seventh via disposed through the dielectric layer and coupled to the seventh contact pad, the seventh via offset from the seventh contact pad in the third direction;
an eighth contact pad disposed on the dielectric layer and immediately adjacent the seventh via; and
an eighth via disposed through the dielectric layer immediately adjacent the seventh contact pad and coupled to the eighth contact pad, the eighth via offset from the eighth contact pad in the fourth direction, the seventh contact pad and the eighth contact pad comprising a second differential pair of contact pads configured to transmit a seventh differential pair of signals.

10. The apparatus of claim 4, wherein the first differential pair is bounded by ground pads and vias coupled to the ground pads in each row and each column adjacent the first differential pair.

11. An apparatus comprising:
a dielectric layer;
a first contact pad disposed on the dielectric layer;
a first via disposed through the dielectric layer and coupled to the first contact pad, the first via and the first contact pad separated by a first distance;
a second contact pad disposed on the dielectric layer, the first contact pad and the second contact pad comprising a first differential pair of contact pads configured to transmit a first differential pair of signals, the second contact pad and the first contact pad separated by a second distance that is greater than the first distance; and
a second via disposed through the dielectric layer and coupled to the second contact pad.

12. The apparatus of claim 11, wherein:
the first via offset is from the first contact pad in a first direction; and
the second via is offset from the second contact pad in a second direction that is opposite of the first direction.

13. The apparatus of claim 12 further comprising:
a third contact pad disposed on the dielectric layer;
a third via disposed through the dielectric layer and coupled to the third contact pad, the third via offset from the third contact pad in a third direction that is perpendicular to the first direction;
a fourth contact pad disposed on the dielectric layer and separated from the third contact pad by the first differential pair of contact pads; and
a fourth via disposed through the dielectric layer and coupled to the fourth contact pad, the fourth via offset from the fourth contact pad in a fourth direction that is perpendicular to the first direction, the third contact pad and the fourth contact pad configured to be coupled to ground.

14. The apparatus of claim 11 further comprising:
a third contact pad disposed on the dielectric layer;
a third via disposed through the dielectric layer and coupled to the third contact pad, the third via and the third contact pad separated by a third distance;
a fourth contact pad disposed on the dielectric layer, the third contact pad and the fourth contact pad comprising a third differential pair of contact pads configured to transmit a third differential pair of signals, the fourth contact pad and the third contact pad separated by a fourth distance that is greater than the third distance; and
a fourth via disposed through the dielectric layer and coupled to the fourth contact pad.

15. The apparatus of claim 14, wherein:
a distance between a closest contact pad of one of the first differential pair or a second differential pair to a via of the other of the first differential pair or the second differential pair is less than a distance between closest contact pads of the first and second differential pairs.

16. The apparatus of claim 11 further comprising:
a ground plane disposed below the dielectric layer, the ground plane having a first aperture through which the first via passes and a second aperture through which the second via passes.

17. An apparatus comprising:
a dielectric layer;
a first contact pad disposed on the dielectric layer;
a first via disposed through the dielectric layer and coupled to the first contact pad, the first via offset from the first contact pad in a first direction;
a second contact pad disposed on the dielectric layer and immediately adjacent the first via; and
a second via disposed through the dielectric layer immediately adjacent the first contact pad and coupled to the second contact pad, the second via offset from the second contact pad in a second direction that is opposite of the first direction, the first contact pad and the second contact pad comprising a first differential pair of contact pads configured to transmit a first differential pair of signals,
wherein the apparatus further comprises a ground structure circumscribing the first differential pair of contact pads and separating the first differential pair of contact pads from a neighboring differential pair of contact pads.

18. The apparatus of claim 1, wherein the dielectric layer is a layer of a printed circuit board.

19. An apparatus comprising:
a dielectric layer;
a first contact pad disposed on the dielectric layer;
a first via disposed through the dielectric layer and coupled to the first contact pad, the first via offset from the first contact pad in a first direction;
a second contact pad disposed on the dielectric layer and immediately adjacent the first via; and
a second via disposed through the dielectric layer immediately adjacent the first contact pad and coupled to the second contact pad, the second via offset from the second contact pad in a second direction that is opposite of the first direction, the first contact pad and the second contact pad comprising a first differential pair of contact pads configured to transmit a first differential pair of signals, wherein the dielectric layer is a layer of an integrated circuit die.

20. An apparatus comprising:
a dielectric layer;
a first contact pad disposed on the dielectric layer;
a first via disposed through the dielectric layer and coupled to the first contact pad, the first via offset is from the first contact pad in a first direction, the first via and the first contact pad separated by a first distance;
a second contact pad disposed on the dielectric layer, the first contact pad and the second contact pad comprising a first differential pair of contact pads configured to transmit a first differential pair of signals, the second contact pad and the first contact pad separated by a second distance that is greater than the first distance;
a second via disposed through the dielectric layer and coupled to the second contact pad the second via is offset from the second contact pad in a second direction that is opposite of the first direction;
a ground plane disposed below the dielectric layer, the ground plane having a first aperture through which the first via passes and a second aperture through which the second via passes;
a third contact pad disposed on the dielectric layer;
a third via disposed through the dielectric layer and coupled to the third contact pad, the third via and the third contact pad separated by a third distance;
a fourth contact pad disposed on the dielectric layer, the third contact pad and the fourth contact pad comprising a second differential pair of contact pads configured to transmit a second differential pair of signals, the fourth contact pad and the third contact pad separated by a fourth distance that is greater than the third distance; and
a fourth via disposed through the dielectric layer and coupled to the fourth contact pad, wherein:
a distance between a closest contact pad of one of the first differential pair or the second differential pair to a via of the other of the first differential pair or the second differential pair is less than a distance between closest contact pads of the first and second differential pairs.

* * * * *